United States Patent [19]
Russell

[11] Patent Number: 6,000,097
[45] Date of Patent: Dec. 14, 1999

[54] INSTRUMENT WITH STRENGTHENED HOLLOW HANDLE

[75] Inventor: Brian G. Russell, Tigard, Oreg.

[73] Assignee: Tektronix, Inc., Wilsonville, Oreg.

[21] Appl. No.: 09/099,513

[22] Filed: Jun. 18, 1998

[51] Int. Cl.[6] ................................................. A47B 95/02
[52] U.S. Cl. ........................................... 16/114.1; 16/444
[58] Field of Search .............................. 16/112, 124–126, 16/111 R, 110 R, DIG. 24, DIG. 18, DIG. 19; 312/244, 223.2; 190/39, 115; 294/27 R; 220/759, 760, 752, 755; 361/680, 681, 724, 725, 752, 757

[56] References Cited

U.S. PATENT DOCUMENTS

| | | | |
|---|---|---|---|
| 2,293,630 | 8/1942 | Ruppel | 16/110 R |
| 2,913,080 | 11/1959 | Louik et al. | 16/126 |
| 3,183,549 | 5/1965 | Hammesfahr | 16/126 |
| 3,813,729 | 6/1974 | Szabo et al. | 16/126 |
| 4,261,078 | 4/1981 | Edwards et al. | 16/126 |
| 4,335,487 | 6/1982 | DiPierro et al. | 16/126 |
| 4,340,990 | 7/1982 | Seynhaeve | 16/126 |
| 4,364,150 | 12/1982 | Remington | 16/126 |
| 5,285,551 | 2/1994 | Weiland et al. | 16/125 |
| 5,860,538 | 1/1999 | Dureo et al. | 16/DIG. 24 |

*Primary Examiner*—Chuck Y. Mah
*Attorney, Agent, or Firm*—Bennet K. Langlotz; Thomas F. Lenihan

[57] ABSTRACT

An elongated bail handle for an electronic instrument housing with opposed ends providing handle mounts. The handle has an elongated intermediate portion extending the width of the instrument, and a pair terminal arm portions each connected to the intermediate portion and having a free end for connection to a respective end surface of the housing. The intermediate portion defines an elongated bore, and a reinforcing bar laterally spans the bore to connect opposed walls of the intermediate portion. The arm and bore may have an oblong cross section, with the bar spanning the short span. The bar may define a passage, and an overmolded handle grip encompassing the reinforcing bar may have material filling the passage to secure it to the handle.

17 Claims, 3 Drawing Sheets

INSTRUMENT WITH STRENGTHENED HOLLOW HANDLE

FIELD OF THE INVENTION

The invention relates to portable instruments, and more particularly to handles for such instruments.

BACKGROUND AND SUMMARY OF THE INVENTION

Portable electronic instruments such as oscilloscopes are often required to be portable for testing devices at various locations. Accordingly, they are typically provided with carrying handles. The handle is typically a bail handle pivotally mounted to opposite side panels at positions near the front panel. The handle has arms that extend parallel to the side panels, with a cross member connecting the handle ends.

A lightweight handle provides improved portability, and a slim handle provides a compact profile and an aesthetic appearance. Having a broad cross section provides a large surface for comfortable carrying. However, these desired qualities are typically contrary to the desire that the handle be stiff. Stiffness provides a quality feel by preventing sagging under load, and allows the handle to be used as a support leg. Moreover, a stiff handle resists unwanted torsional flexing in which the arms are pivoted to different angles twists, which can potentially lead to the arms locking in a different angular positions. Essentially, a closed or tubular cross section provides good stiffness, although it is not readily moldable by conventional techniques.

Tubular members with circular cross sections have been effective to provide relatively lightweight and stiff handles and to resist collapse under limited lateral compressive loads, such as occur during secondary molding operations when a conformal elastomeric grip is molded about a rigid plastic handle. Handles with non-circular cross sections are susceptible to collapse under these substantial loads. While a thin wall design may be acceptable for the limited forces faced during normal use, it may fail during secondary molding. Thus, even designers using advanced plastic molding techniques to create hollow handles of wide diverse shapes are limited in the cross sectional aspect ratio they may employ. There remains a need for a readily moldable instrument handle with good torsional strength, and particularly for a handle with a non-circular cross section.

The embodiments disclosed herein overcome these limitations by providing an elongated bail handle for an electronic instrument housing with opposed ends providing handle mounts. The handle has an elongated intermediate portion extending the width of the instrument, and a pair terminal arm portions each connected to the intermediate portion and having a free end for connection to a respective end surface of the housing. The intermediate portion defines an elongated bore, and a reinforcing bar laterally spans the bore to connect opposed walls of the intermediate portion. The arm and bore may have an oblong cross section, with the bar spanning the short span. The bar may define a passage, and an overmolded handle grip encompassing the reinforcing bar may have material filling the passage to secure it to the handle.

DETAILED DESCRIPTION OF A PREFERRED EMBODIMENT

Figure 1:
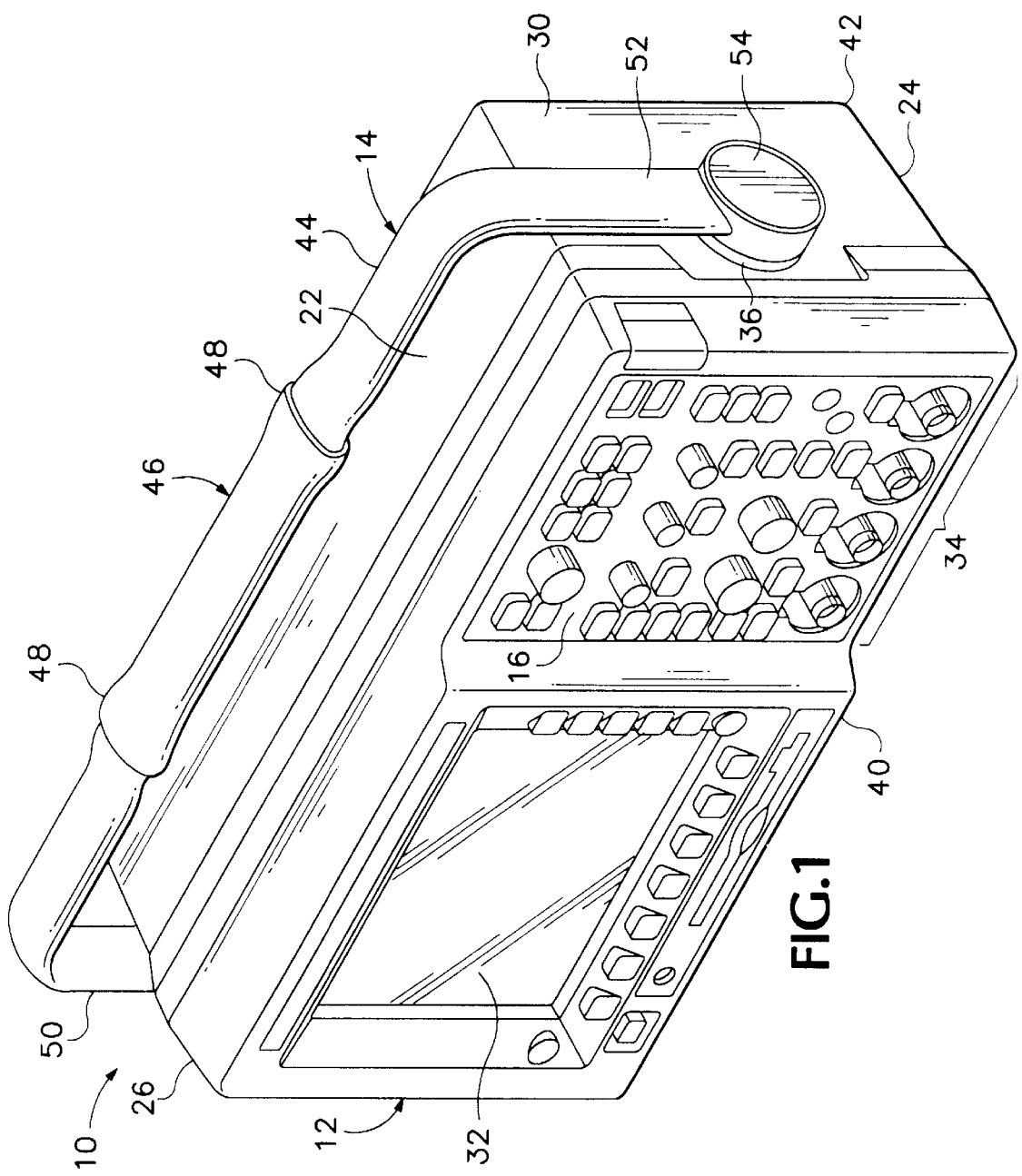
FIG. 1 is a perspective view of an instrument according to a preferred embodiment of the invention.

FIG. 1 shows a compact portable oscilloscope 10 having a housing 12 and a movable bail handle 14. The housing has a generally orthogonal box-like shape, with a front surface 16, a rear surface 20, top surface 22, bottom surface 24, and left and right side or end surfaces 26 and 30. A display screen 32 and interface panel 34 having numerous controls and lead connectors occupy the front panel. The side panels each have a central pivot boss 36 to support the handle 14.

The display screen 32 is a flat panel display having minimal intrusion into the chamber defined by the housing, permitting the housing to have a limited depth less than or comparable to the housing's height, and substantially less than the width of the housing. In the preferred embodiment, the housing has a width of 13", a depth of 6", and a height of 7". The generally box-like shape provides the bottom panel with a front edge 40 where it intersects the front panel 16, and a rear edge 42 where it intersects the rear panel 20. In the carrying position shown, with the bottom panel horizontal, and the handle in a vertically upward extending position, the front and rear edges provide some stability when the bottom panel rests directly on a flat surface.

The handle 14 is a hollow, rigid plastic elongated member having an oval cross section for torsional rigidity. In alternative embodiments, the handle may have any oblong cross section, or may have other tubular shapes. The handle has an elongated cross member or intermediate portion 44 extending the width of the housing and having a centrally located hand grip 46. The grip 46 has a resilient elastomeric surface that resists sliding on smooth surfaces when used as a support leg, and has an elongated central portion terminated by a pair of enlarged lobes 48 that are widely spaced apart by at least about one third the length of the handle.

A pair of arms 50, 52 extends perpendicularly from each end of the cross member to provide a bail shape. A pivot mechanism 54 is connected to the free end of each arm. Each pivot mechanism is connected to a respective boss 36 on the housing, and includes a limiter that prevents the handle from pivoting beyond a selected range of motion. The pivot mechanism also includes a stop, lock or detent mechanism, so that the handle is made stable in several selected different angular positions, to the rear and below the instrument, providing a support for different viewing angles. In each of the stable positions, the handle resists movement in response to a limited force below a selected threshold, so that the weight of the instrument or forces associated with operation do not move the handle. A deliberate force, such as to unlock a stop, or to overcome a resistance are required to move the handle. The pivot, limit, and stop mechanisms may include components mounted on the arm and on the housing to operate in concert. The handle pivots through a range of several alternative handle positions. With spring biased detent mechanisms in each of the pivot hubs, the handle may be moved by applying force to the grip portion of the handle.

Figure 2:
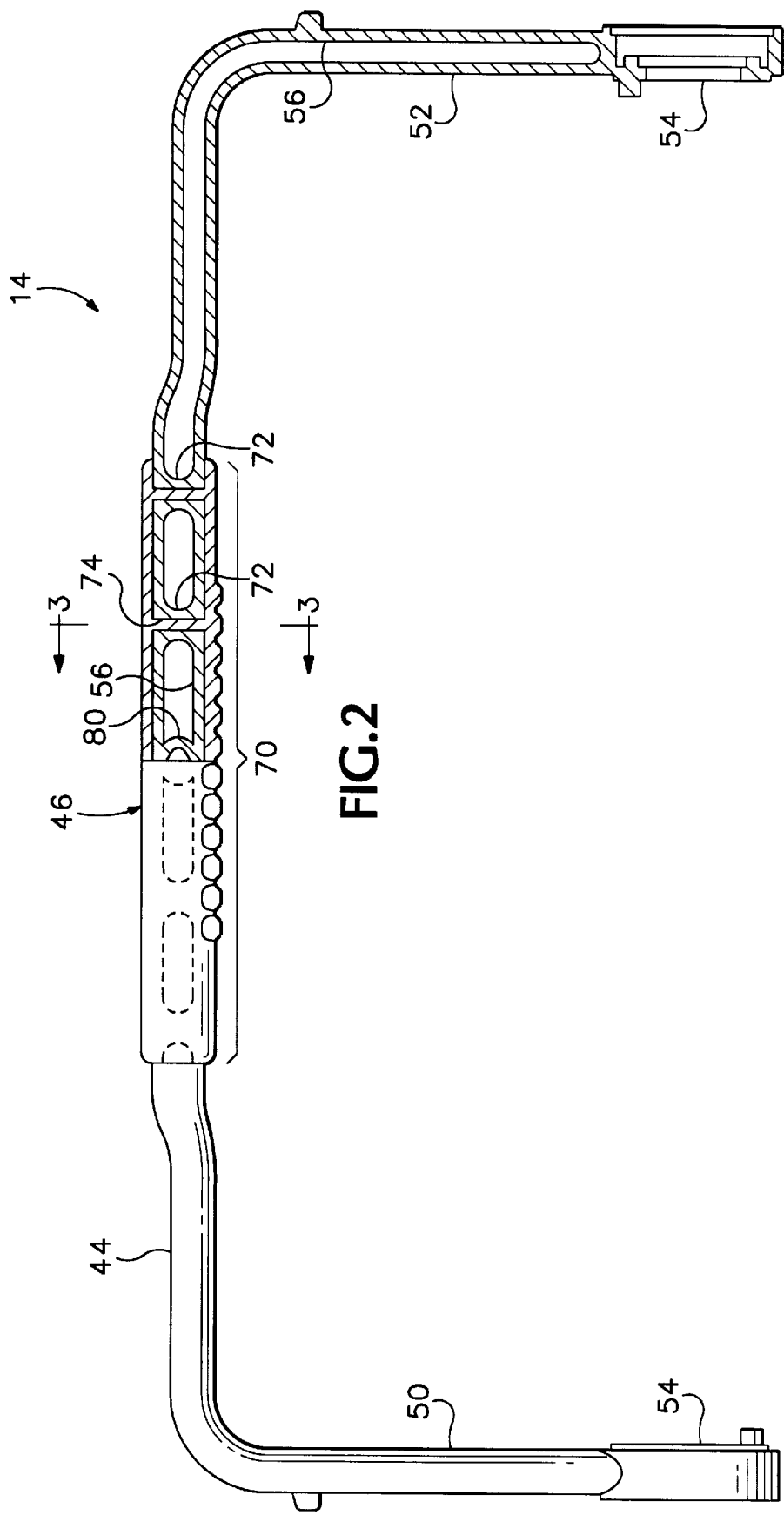
FIG. 2 is an sectional view of the handle of the instrument of FIG. 1.
Figure 3:
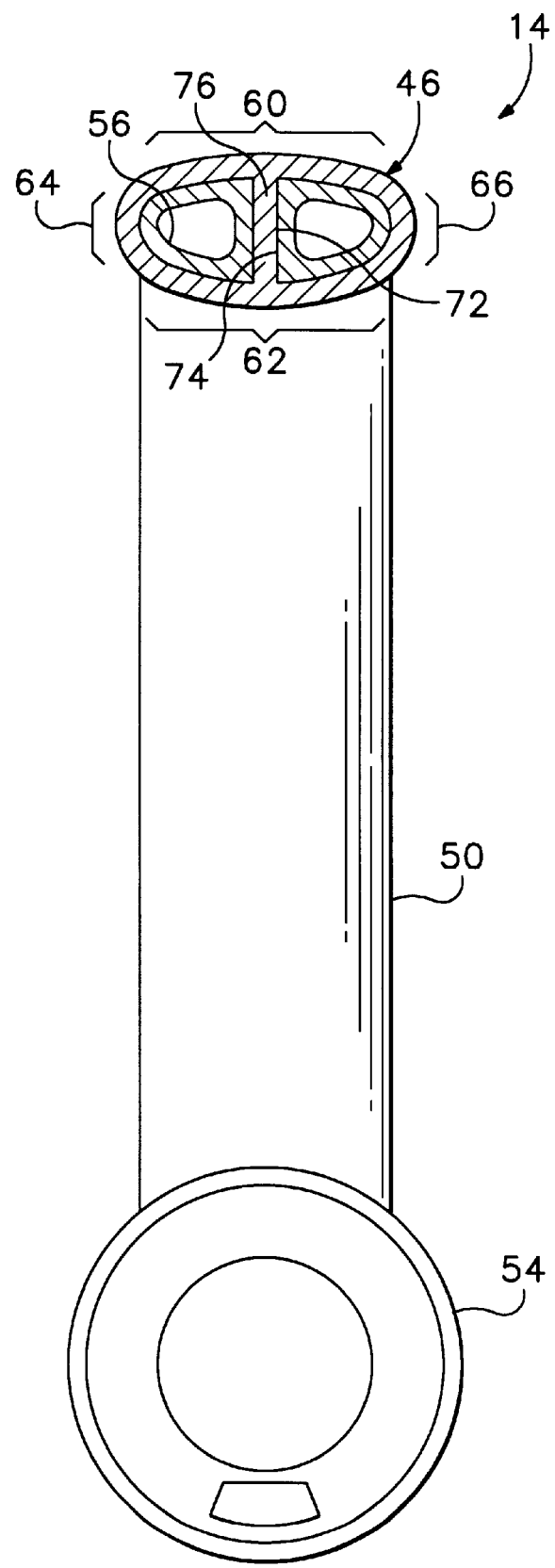
FIG. 3 is a sectional end view of the handle of FIG. 1 taken along line 3—3 of FIG. 2.

FIGS. 2 and 3 show the handle 14 in cross sectional detail. Except for the circular pivot ends 54, the handle is a hollow tube defining a bore 56 extending the length of the intermediate portion 44 and the arm portions. The bore is entirely enclosed to define a single chamber. Depending on the manufacturing process, minimal apertures not affecting structural characteristics may open into the bore from the exterior. The majority of the handle has an approximately constant wall thickness, with the bore having an oblong or oval cross section concentric with the exterior profile. As shown in FIG. 3, the handle has broad, gently curved upper and lower walls 60, 62, and more sharply radiused edge walls 64, 66.

The grip 46 conformally encompasses a central portion 70 of the handle, in which several support columns or bars 72 are formed. Each support bar spans between the upper wall 60 and lower wall 62, centrally positioned between the handle edges 64, 66. The bar essentially functions as a column bearing compressive forces between a floor and a ceiling. The bar is integrally formed with the handle, and is chamfered or filleted where it meets the interior surface of the bore to reduce stress concentrations. As shown, the bar separates the bore into two parts that pass laterally on opposite sides of the bar, and rejoin past the bar.

Although many advantages may be obtained with a solid bar, in the preferred embodiment the bar defines a central passage 74 extending axially through the bar, perpendicular to the length of the handle portion. The central passage does not communicate with the bore 56. The grip is cast or molded conformally about the handle, so that some of the grip material fills each of the passages, melding with grip material entering the passage from the opposite end to form a rope 76 of grip material integral with the grip and securing it to the handle against slippage. Although the preferred grip material is Desmopan thermoplastic elastomer by Bayer, which has a thermoplastic matrix that chemically bonds to the polycarbonate handle, the rope of grip material is particularly important when using grip materials that do not provide such a bond, but provide only a mechanical connection.

In the preferred embodiment, the handle is molded of polycarbonate with a 20% glass fiber fill for strength reinforcement. The grip is formed of thermoplastic polyurethane, which chemically bonds to the handle. The handle cross section has a typical height of 0.410 inch, and depth of 1.125 inch, with a wall thickness of about 0.10 inch. The bars are about 0.30 inch in diameter at their midsections, and the passages are 0.10 inch in diameter. With a grip length of about 6 inches, the bars are positioned at about 1-⅜ and 2-⅝ inches on each side of the central gate 80

The handle is preferably manufactured by gas assisted injection molding. In this process, a tool is created with a cavity shaped to form the exterior of the handle, and with cylindrical pins passing through the cavity defined by the mold at positions corresponding to the bar passages 74. A central gate positioned at the midpoint of the handle along an edge 64 or 66 provides for injection of liquid thermoplastic into the mold. Using gas assisted molding, a volume of liquid thermoplastic is injected into the cavity. The plastic volume is less than the volume of the cavity, so that it does not initially reach the free ends of the handle arms.

Then, a volume of nitrogen or other inert gas is injected into the gate to form a bubble that propels some of the plastic to fill the remainder of the cavity. Because the injected plastic that contacts the cooler tool surfaces or pins "freezes" rapidly, only the central core of material remains liquid or molten at the time of gas injection. Thus, the gas bubble does not displace this shell of material, but merely displaces the central liquid core to form the eventual bore, and to fill the remaining mold cavity. This process inherently creates thicker walls at corners and vertexes to generate chamfers. The bore surface is slightly rough and irregular, and may narrow adjacent the ends of the arms, providing added material for strength where needed.

The pins are withdrawn, the tool separated, and the handle ejected. Then, the handle is placed in another tool with a cavity that closely receives the handle, except in the central portion 70, where the tool cavity is spaced apart from the handle surface to accommodate the thickness and contour of the grip 46. In this press, liquid thermoplastic polyurethane in injected at approximately 6000 to 15,000 pounds per square inch. Thus, the approximately inch-wide and six-inch-long central portion of the handle is subject to about 36,000 to 90,000 pounds of force. This force would likely be sufficient to excessively flatten the handle, but deformation is prevented by the support of the four reinforcement bars. Deformation would be unacceptable for the additional reason that flexing of the handle would allow injected grip material to escape where the mold would normally be sealed against the handle. A secondary benefit of the molding process is that reinforcing bar is loaded in compression during the overmolding process, so that it enjoys the inherent principle that thermoplastics are stronger in compression than in flexure.

While the disclosure is made in terms of a preferred embodiment, the invention is not intended to be so limited.

I claim:

1. An elongated bail handle for an electronic instrument housing having opposed end surfaces spaced apart to define a width of the instrument, the handle comprising;

an elongated intermediate portion for extending the width of the instrument;

a pair terminal arm portions each connected to the intermediate portion and having a free end for connection to a respective end surface of the housing;

the intermediate portion surrounding an elongated bore; and a reinforcing bar spanning the elongated bore across an axis of the elongated bore to connect opposing portions of internal surfaces of the intermediate portion of said handle;

the reinforcing bar being a substantially cylindrical column having a passage formed therethough along the longitudinal axis of the column; and the reinforcing bar and the intermediate portion of the handle being molded of the same material at substantially the same time.

2. The handle of claim 1 wherein the intermediate portion has an oblong cross section.

3. The handle of claim 2 wherein the oblong cross section has a width less than its length, and the bar spans the width of the cross section.

4. The handle of claim 2 wherein the intermediate portion has an elliptical cross section.

5. The handle of claim 1 wherein the bore is an entirely enclosed chamber.

6. The handle of claim 1 wherein the terminal arm portions are angularly offset from the intermediate portion, and wherein the bore extends through the arm portions and the intermediate portion.

7. The handle of claim 6 including a sleeve portion conformally surrounding the intermediate portion and including a securement portion occupying the passage.

8. The handle of claim 1 wherein the intermediate portion is formed of a first material, and an area of the intermediate portion including the bar is conformally encompassed by a different second material.

9. An electronic instrument comprising:

an housing including a pair of handle mounts;

a handle having an elongated intermediate portion, and free ends connected to the handle mounts;

the intermediate portion surrounding an elongated bore; and at least a reinforcing bar laterally spanning the bore to connect opposing portions of internal surfaces of the intermediate portion;

the reinforcing bar being a substantially cylindrical column having a passage formed therethough along the longitudinal axis of the column; and the reinforcing bar and the intermediate portion of the handle being molded of the same material at substantially the same time.

10. The instrument of claim 9 wherein the intermediate portion has an oblong cross section.

11. The instrument of claim 10 wherein the bar spans shortest span of the cross section.

12. The instrument of claim 9 wherein the free ends are angularly offset from the intermediate portion, and wherein the bore extends through the arm portions and the intermediate portion.

13. The instrument of claim 9 wherein the intermediate portion is formed of a first material, and an area of the intermediate portion including the bar is conformally encompassed by a different second material.

14. The instrument of claim 9 including a sleeve portion conformally surrounding the intermediate portion and including a securement portion occupying the passage.

15. An elongated handle member comprising;

an elongated body surrounding an elongated bore extending a major portion of the length of the body;

at least an intermediate portion of the body having an oblong cross section;

a reinforcing bar within the bore and having opposed ends, each of said ends being connected to opposing portions of internal surfaces of the body;

the cross section having a shorter width axis perpendicular to the length of the body; and the reinforcing bar extending along the width axis;

the reinforcing bar being a substantially cylindrical column having a passage formed therethough along the longitudinal axis of the column; and the reinforcing bar and the intermediate portion of the handle being molded of the same material at substantially the same time.

16. The handle of claim 15 wherein the bore is an entirely enclosed chamber.

17. The handle of claim 15 wherein the handle includes a grip portion conformally surrounding the intermediate portion and including a securement portion of the grip occupying the passage.

\* \* \* \* \*